(12) United States Patent
Matsuyama

(10) Patent No.: US 11,844,167 B2
(45) Date of Patent: Dec. 12, 2023

(54) LIGHT SOURCE DEVICE

(71) Applicant: FUJI CORPORATION, Chiryu (JP)

(72) Inventor: Kazuya Matsuyama, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 36 days.

(21) Appl. No.: 17/633,104

(22) PCT Filed: Aug. 5, 2019

(86) PCT No.: PCT/JP2019/030772
§ 371 (c)(1),
(2) Date: Feb. 4, 2022

(87) PCT Pub. No.: WO2021/024361
PCT Pub. Date: Feb. 11, 2021

(65) Prior Publication Data
US 2022/0338332 A1  Oct. 20, 2022

(51) Int. Cl.
*H05B 47/155*  (2020.01)
*H05K 13/04*  (2006.01)
*H05B 47/29*  (2020.01)

(52) U.S. Cl.
CPC ........... *H05B 47/29* (2020.01); *H05B 47/155* (2020.01)

(58) Field of Classification Search
CPC ...... H05B 47/29; H05B 47/155; H05K 13/04; H05K 13/0413; H05K 13/0812; H05K 13/08; H05K 13/0813; H05K 13/0411
See application file for complete search history.

(56) References Cited

U.S. PATENT DOCUMENTS

2017/0064883 A1 *  3/2017  Kawai ............... H05K 13/0812

FOREIGN PATENT DOCUMENTS

| EP | 3 071 007 A1 | 9/2016 |
| JP | 2011-100929 A | 5/2011 |
| JP | 2013-191771 A | 9/2013 |
| JP | 5971992 B2 * | 8/2016 |
| JP | 2017-220544 A | 12/2017 |
| WO | WO 2019/064609 A1 | 4/2019 |

OTHER PUBLICATIONS

International Search Report dated Oct. 29, 2019 in PCT/JP2019/030772 filed on Aug. 5, 2019, 2 pages.

* cited by examiner

*Primary Examiner* — Henry Luong
(74) *Attorney, Agent, or Firm* — Oblon, McClelland, Maier & Neustadt, L.L.P.

(57) ABSTRACT

In light source device 60, which is disposed in a component mounter for holding a component by using mounting head 24 and mounting a held component that is the component that has been held on a board, and used when the held component is imaged by imaging device 50, and includes multiple light sources 62; and controller 64 configured to control the multiple light sources, when one or more of the multiple light sources do not emit light, the controller executes light intensity enhancement processing of enhancing an intensity of light emitted by any of the other light sources among the multiple light sources. By executing the light intensity enhancement processing, in a case where any of the multiple light sources fails, it is possible to reduce a possibility that a component mounting operation by the component mounter is stopped.

3 Claims, 4 Drawing Sheets

LIGHT SOURCE DEVICE

TECHNICAL FIELD

The present application relates to a light source device to be disposed in a component mounter.

BACKGROUND ART

In a component mounter for mounting, on a board, a held component which is a component held by a mounting head, the held component is imaged by an imaging device for a purpose of confirming a held posture of the held component or the like, and at the time of imaging, a light source device is operated. The light source device is a device, for example, as described in the following Patent Literature and includes multiple light sources, more specifically, multiple LED illuminants.

PATENT LITERATURE

Patent Literature 1: JP-A-2017-220544

BRIEF SUMMARY

Technical Problem

In the light source device having the multiple light sources, in a case where the multiple light sources in fail, at present, even if there is only one light source that cannot emit light, a component mounting operation by the component mounter, in which the light source device is disposed, is stopped. This causes the efficiency of the component mounting operation to be decreased. By suppressing this decrease in efficiency as much as possible, the practicality of the light source device to be disposed in the component mounter can be enhanced. The present disclosure has been made in view of such circumstances and an object of the present disclosure is to provide a light source device having a high practicality.

Solution to Problem

In order to solve the above-mentioned problems, there is provided a light source device of the present disclosure, which is disposed in a component mounter for holding a component by using a mounting head and mounting a held component that is the component that has been held on a board, and used when the held component is imaged by an imaging device, the light source device including: multiple light sources; and a controller configured to control the multiple light sources. When one or more of the multiple light sources do not emit light, the controller executes light intensity enhancement processing of enhancing an intensity of light emitted by any of the other light sources among the multiple light sources.

Advantageous Effects

According to the light source device of the present disclosure, by executing the light intensity enhancement processing, in a case where any of the multiple light sources fails, it is possible to reduce a possibility that a component mounting operation by the component mounter is stopped. That is, by suppressing a decrease in the efficiency of the component mounting operation as much as possible, the light source device has a high practicality.

DESCRIPTION OF EMBODIMENTS

Hereinafter, a representative embodiment of the present disclosure will be described in detail with reference to the drawings as an embodiment. In addition to the following embodiment, it is possible to embody the present disclosure in various aspects in which various changes and improvements are carried out based on the knowledge of a person skilled in the art.

Embodiments

[A] Overall Configuration of Component Mounter

Figure 1:
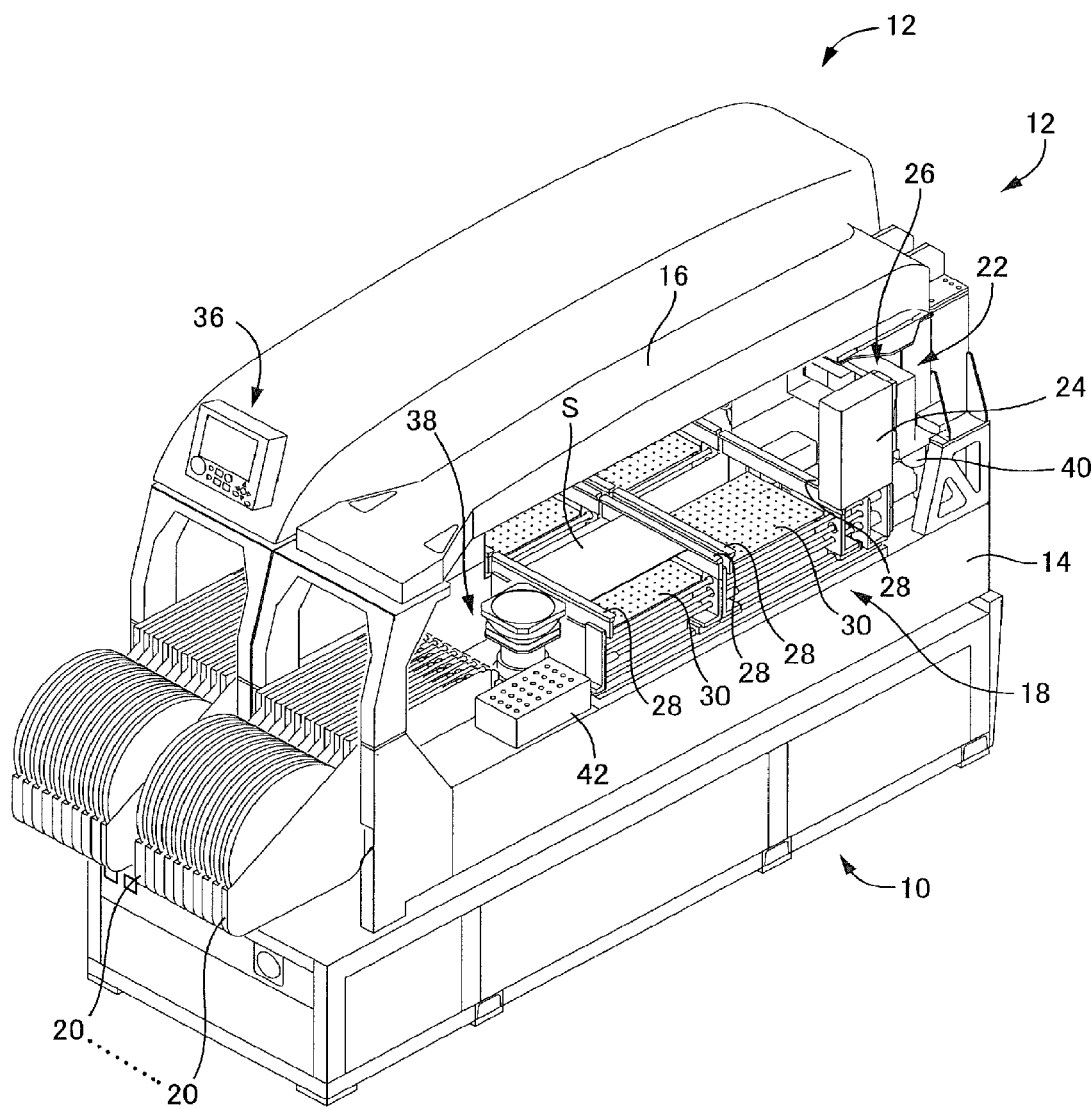
FIG. 1 is a view illustrating an overall configuration of a component mounter in which a light source device according to an embodiment is disposed.

As illustrated in FIG. 1, a component mounter on which a light source device according to an embodiment is disposed is incorporated in a component mounting system, and the system includes system base 10 and two component mounters 12 disposed side by side in system base 10. Two component mounters 12 have the same configuration as each other (a portion of a panel on a front side is removed), and each thereof is a component mounter in which the light source device of the embodiment is disposed.

Component mounter 12 includes base 14 and a main body configured by frame 16 disposed on base 14. Conveyor device 18 is disposed at a center portion in a front-rear direction on base 14 and multiple component feeders 20 each functioning as a component supply device are disposed side by side in a left-right direction at a front portion. In addition, component mounting device 22 serving as a board working device is supported by frame 16. Component mounting device 22 includes mounting head 24 having a suction nozzle that is a component holding device, and head moving device 26 that is an XY-type moving device that moves mounting head 24 in front, rear, left, and right.

Conveyor device 18 is a device for conveying board S to left and right in front-rear two lanes and includes a pair of support plates 28 that are erected with respect to each lane so as to face each other in the front and rear, and respectively support a conveyor belt (not illustrated) so as to be circulated, and lifting and lowering base 30 disposed between the pair of support plates 28 for lifting the board from below. Board S is conveyed in the left-right direction by the conveyor belt, and board S, which has been conveyed to a set position during a component mounting operation, is fixed in a state of being locked to each upper end of the pair of support plates 28 by lifting and lowering base 30 being lifted. That is, conveyor device 18 functions as a board fixing device for fixing board S during the component mounting operation.

Figure 2:
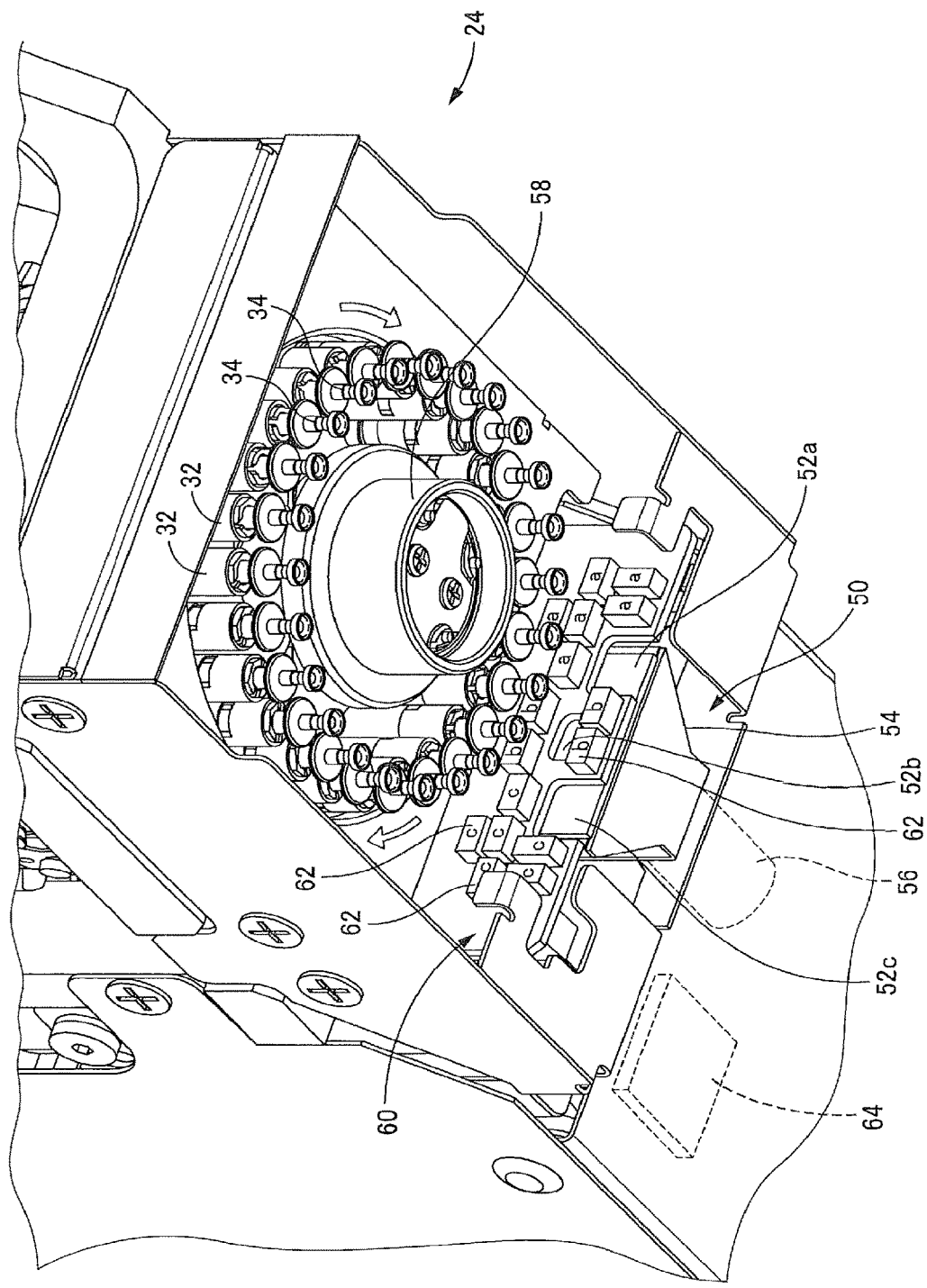
FIG. 2 is a perspective view illustrating a light source device according to an embodiment and an imaging device for imaging a component using the light source device from a viewpoint from diagonally below.

As illustrated in FIG. 2 which is a view seen from diagonally below, mounting head 24 has twenty-four lifting and lowering rods 32 disposed on a circumference about an axis extending in an up-down direction, and suction nozzle 34 is detachably attached to each lower end of lifting and lowering rods 32. Twenty-four lifting and lowering rods 32 are simultaneously index-rotated, exist at the innermost positions set as the lifting and lowering stages, and are lifted and lowered when the component is removed from component feeder 20 and the held component is mounted on board S, which will be described later.

The component mounting operation is performed while mounting head 24 is moved between component feeder 20 and board S fixed by conveyor device 18, by head moving device 26. Specifically, mounting head 24 holds the component supplied from component feeder 20 in suction nozzle 34 while index-rotating lifting and lowering rod 32, and places the held component, which is the component to be held, on board S fixed by conveyor device 18 while index-rotating lifting and lowering rod 32. The control of conveyor device 18, component feeder 20, component mounting device 22, and the like in the component mounting operation is performed by control device 36 in which an operation panel is integrated.

As will be described in detail later, component camera 38 is provided between conveyor device 18 and component feeder 20, a component held by mounting head 24 is imaged by component camera 38, a deviation amount of a holding position of the component is acquired by processing with respect to the image acquired by the imaging, and the placing of the component on board S is performed while considering the deviation amount. On the other hand, board camera 40 for imaging a surface of board S is provided together with mounting head 24, so as to be moved integrally with mounting head 24 by head moving device 26. Board camera 40 serving as an imaging device images a reference mark provided on board S during the component mounting operation, a deviation amount of the position of fixed board S, that is, a deviation amount of the fixed position is acquired by processing of the acquired image, and the placing of the component on board S is performed while considering the deviation amount. The image processing and the acquisition of the deviation amount are also performed by control device 36.

In component mounter 12, nozzle tray 42 capable of accommodating suction nozzle 34 is attached to base 14, accommodated suction nozzle 34 is automatically attached to a lower end of each of lifting and lowering rods 32 of mounting head 24 by control device 36, and suction nozzle 34 attached to the lower end of each of lifting and lowering rods 32 is automatically accommodated in nozzle tray 42.

[B] Side Surface Imaging Device And Light Source Device

As illustrated in FIG. 2, component mounter 12 includes side surface imaging device 50 in mounting head 24. Side surface imaging device 50 has three light receiving sections 52a, 52b, and 52c, and is configured to collect the light received by light receiving sections 52a, 52b, and 52c by prism unit 54 and guide the light into camera 56. Side surface imaging device 50 images, by camera 56, suction nozzle 34 attached to each of three lifting and lowering rods 32 located in the above-mentioned lifting and lowering stage, and the front and rear stage in the index-rotation direction (white arrow in the drawing), that is, each of the front stage and the rear stage, and the component held by suction nozzle 34 in a case where suction nozzle 34 picks up and holds the component, from a side thereof, corresponding to three light receiving sections 52a, 52b, and 52c.

Mounting head 24 is provided with fluorescent ring 58, which is an annular phosphor having a same axis as a center axis of the index-rotation, at a center of twenty-four lifting and lowering rods 32. Fluorescent ring 58 serves as a background in an image imaged by side surface imaging device 50.

Light source device 60 irradiates fluorescent ring 58 with light (more specifically, ultraviolet light) when imaging is performed by side surface imaging device 50. Fluorescent ring 58 emits fluorescence, which is visible light, by the irradiated ultraviolet light, so that an image imaged by side surface imaging device 50 is a silhouette image.

Light source device 60 has multiple light sources disposed on one plane, more specifically, sixteen LED illuminants 62 each serving as a light source, in consideration of light shading by suction nozzle 34 ahead. The light emission of LED illuminants 62 is performed by controller 64 included in light source device 60. Controller 64 is configured to include a computer and a driver for each of LED illuminants 62. The computer is connected to control device 36 described above and causes LED illuminant 62 to emit light based on a command from control device 36. The computer is configured to control a current supplied from each driver to corresponding LED illuminant 62, so that light source device 60 can change an intensity of the light emitted from each LDE illuminant 62. Incidentally, by enhancing the intensity of the light emitted from one LDE illuminant 62, a brightness of an area of fluorescent ring 58 which is irradiated with the light from LDE illuminant 62 is improved.

Figure 3:
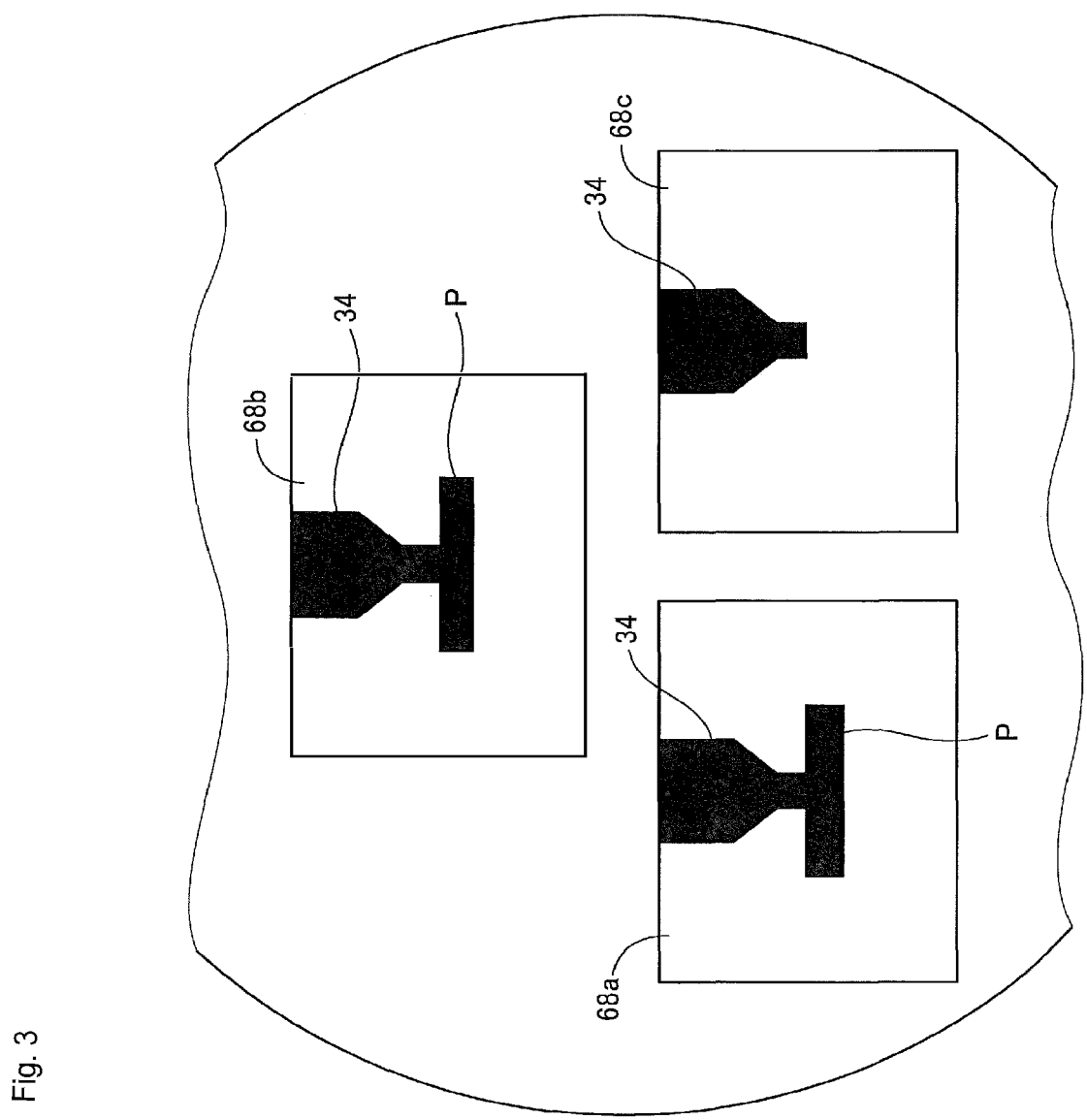
FIG. 3 is a view schematically illustrating an image acquired by the imaging device.

The image obtained by the imaging of side surface imaging device 50 is, for example, as illustrated in FIG. 3. Based on the light received by each of light receiving sections 52a, 52b, and 52c, and suction nozzle 34 located in the front stage, the lifting and lowering stage, and the rear stage described above, and component P picked up and held by suction nozzle 34 are imaged in each of three image areas 68a, 68b, and 68c in one visual field. The imaging by side surface imaging device 50 is performed in any of a removing step of component P from component feeder 20 by mounting head 24 and a mounting step of component P on board S. Incidentally, since the image illustrated in FIG. 3 is an image in the mounting step, component P is not picked up and held by suction nozzle 34 located in the rear stage.

By imaging of side surface imaging device 50, it is possible to recognize whether component P is held by suction nozzle 34, and a dimension and a posture of component P in a case where component P is held by suction nozzle 34, and it is possible to confirm that the component mounting operation by component mounter 12 is appropriately performed or has been performed.

[C] Response to Failure of Light Source

In a case where a failure occurs in which any of sixteen LED illuminants 62 does not emit light, it is expected that a brightness of a portion of fluorescent ring 58 decreases, so that an appropriate silhouette image cannot be obtained by side surface imaging device 50. Heretofore, in a case where even one of sixteen LED illuminants 62 does not emit light, the component mounting operation by component mounter 12 has been stopped. This leads to a decrease in the work efficiency of component mounter 12. Accordingly, in light source device 60, depending on an extent of the failure, it is configured to cope with the failure in order to continue the mounting operation of component mounter 12.

Figure 4:
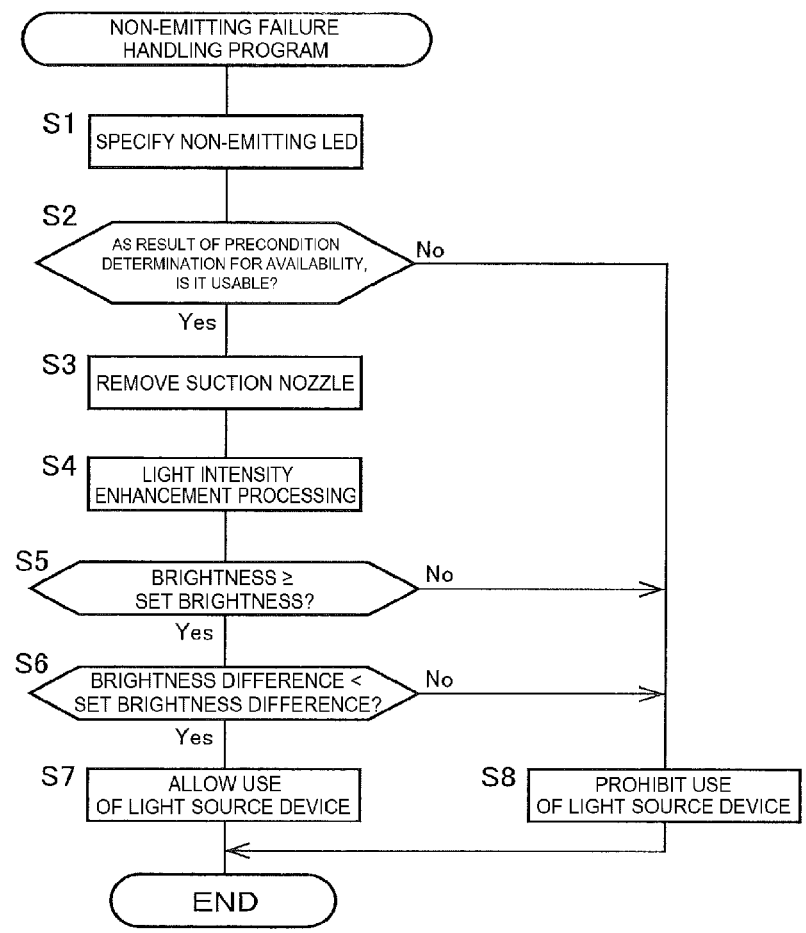
FIG. 4 is a flowchart illustrating a non-emitting failure handling program executed in the light source device of the embodiment.

In a case where even one of LED illuminants 62 scheduled to emit light based on the command to emit light does not emit light, controller 64 of light source device 60 has a function of recognizing that a non-emitting failure has occurred in light source device 60, that is, a self-diagnosis function, and when it is recognized that the non-emitting failure has occurred, a non-emitting failure handling program illustrated in a flowchart in FIG. 4 is executed by the computer of controller 64.

To explain processing according to this program, first, in step 1 (hereinafter, abbreviated as "S1, the same applies to other steps), LED illuminant 62 (hereinafter, may be referred to "non-emitting LED") that does not emit light is specified. This specification is performed by using the self-diagnosis function while controller 64 sequentially issues a light emission command to each of sixteen LED illuminants 62.

Next, in S2, as a precondition determination for availability, in a case where two or more LED illuminants 62 do not emit light, it is determined whether any two of two or more non-emitting LEDs 62 are in a specific positional relationship. Specifically, sixteen LED illuminants 62 are divided into three groups roughly corresponding to three light receiving sections 52a, 52b, and 52c, that is, three image areas 68a, 68b, and 68c (in FIG. 2, respective LED illuminants 62 are denoted by a, b, and c corresponding to the three groups) and in a case where any two non-emitting LEDs 62 belong to the same group, it is determined that the use of light source device 60 has to be prohibited. In other words, in a case where there are no two or more non-emitting LEDs 62 in any group, it is determined that light source device 60 is usable. Instead of the above determination condition, it may be determined that light source device 60 is usable under another condition, for example, under a condition that two adjacent LED illuminants 62 are not emitting light.

In S2, in a case where it is determined that it is usable, in S3, a command is sent from controller 64 to control device 36 so as to remove all 24 suction nozzles 34. Based on this command, control device 36 operates component mounter 12 so as to automatically remove suction nozzle 34 from mounting head 24.

Next, in S4, the brightness of the fluorescence of fluorescent ring 58, specifically, the brightness (strictly speaking, the "average brightness") of each of three image areas 68a, 68b, and 68c is measured by side surface imaging device 50 while gradually enhancing the intensity of the light emitted from other LED illuminants 62 other than non-emitting LEDs 62 in the group where the non-emitting LEDs 62 are present by a set value. This processing is processing that can be referred to as light intensity enhancement processing, and is performed until the brightness of each of three image areas 68a, 68b, and 68c reaches the set brightness. In a case where the brightness of any of three image areas 68a, 68b, and 68c reaches the set brightness by the light intensity enhancement processing, in S5, it is determined that light source device 60 is usable. On the other hand, even if the light intensity enhancement processing is performed up to an upper limit, in a case where the brightness of any of three image areas 68a, 68b, and 68c has not reached the set brightness, that is, in a case where a portion that does not greater than or equal to the set brightness is present in fluorescent ring 58, in S5, it is determined that the use of light source device 60 has to be prohibited.

In S5, in a case where it is determined that the brightness of any of three image areas 68a, 68b, and 68c reaches the set brightness, in S6, it is determined whether light source device 60 is usable based on the brightness distribution in each of three image areas 68a, 68b, and 68c. Specifically, in any of image areas 68a, 68b, and 68c, it is determined that light source device 60 is usable in a case where a brightness difference between a high brightness portion, which is the highest brightness portion, and a low brightness portion, which is the lowest brightness portion, is less than a set brightness difference. In other words, in a case where the brightness difference between the high brightness portion and the low brightness portion in any of three image areas 68a, 68b, and 68c is greater than or equal to the set brightness difference, it is determined that the use of light source device 60 has to be prohibited. Instead of such a condition, it may be determined that the use of light source device 60 has to be prohibited under another condition, for example, a condition that the brightness difference between the high brightness portion and the low brightness portion in entire three image areas 68a, 68b, and 68c is greater than or equal to the set brightness difference.

In S6, in a case where it is determined that the brightness difference between the high brightness portion and the low brightness portion in any of image areas 68a, 68b, and 68c is less than the set brightness difference, in S7, the use of light source device 60 is allowed. On the other hand, in any of S2, S5, and S6, in a case where it is determined that the use of light source device 60 has to be prohibited, in S8, the use of light source device 60 is prohibited.

As described above, according to a series of processing according to the program, even in a case where any of multiple LED illuminants 62 fails, specifically, even in a case where two or more LED illuminants 62 do not emit light, it is possible to reduce a possibility that the component mounting operation by component mounter 12 is stopped.

The precondition determination for availability in S2 is processing provided in order to prohibit the use of light source device 60 without performing a complicated operation of removing suction nozzle 34 from mounting head 24, in a case where two non-emitting LEDs 62 are present in the same group, in consideration of a fact that there is a high probability that an appropriate silhouette image corresponding to the group cannot be obtained. The determinations of S5 and S6 are also processing that is provided on the assumption that there is a high probability that an appropriate silhouette image cannot be obtained even if the light intensity enhancement processing is performed.

REFERENCE SIGNS LIST

12: component mounter, 24: mounting head, 34: suction nozzle, 50: side surface imaging device, 52a, 52b, 52c: light receiving section, 54: prism unit, 56: camera, 58: fluorescent ring, 60: light source device, 62: LED illuminant [light source], 64: controller, 68a, 68b, 68c: image area, S: board, P: component

The invention claimed is:
1. A light source device, which is disposed in a component mounter including a mounting head that holds and mounts a component on a board, comprising:
multiple light sources configured to illuminate the component held by the mounting head when the component imaged by an imaging device; and
a controller configured to control the multiple light sources,
wherein when one or more of the multiple light sources do not emit light, the controller executes light intensity enhancement processing of enhancing an intensity of light emitted by any of other light sources among the multiple light sources, wherein each of the multiple light sources irradiates a phosphor with ultraviolet light in order to allow the imaging device to capture a silhouette image of the component held by the mounting head by using fluorescence emitted from the phosphor, and wherein the controller prohibits an operation of the light source device when a portion where a brightness is not greater than or equal to a set brightness is present in the phosphor even when the light intensity enhancement processing is performed.

2. A light source device, which is disposed in a component mounter including a mounting head that holds and mounts a component on a board, comprising:

multiple light sources configured to illuminate the component held by the mounting head when the component imaged by an imaging device; and a controller configured to control the multiple light sources, wherein when one or more of the multiple light sources do not emit light, the controller executes light intensity enhancement processing of enhancing an intensity of light emitted by any of other light sources among the multiple light sources, wherein each of the multiple light sources irradiates a phosphor with ultraviolet light in order to allow the imaging device to capture a silhouette image of the component held by the mounting head by using fluorescence emitted from the phosphor, and wherein the controller prohibits an operation of the light source device when a brightness difference between a high brightness portion and a low brightness portion of the phosphor is greater than or equal to a set difference even when the light intensity enhancement processing is performed.

3. A light source device, which is disposed in a component mounter including a mounting head that holds and mounts a component on a board, comprising:

multiple light sources configured to illuminate the component held by the mounting head when the component imaged by an imaging device; and a controller configured to control the multiple light sources, wherein when one or more of the multiple light sources do not emit light, the controller executes light intensity enhancement processing of enhancing an intensity of light emitted by any of other light sources among the multiple light sources, and wherein when two or more of the multiple light sources do not emit light, the controller specifies two or more of the multiple light sources and executes the light intensity enhancement processing on a precondition that a relationship between disposition positions of the two or more of the multiple light sources is not a specific relationship.

* * * * *